(12) United States Patent
Hellwig et al.

(10) Patent No.: US 8,614,797 B2
(45) Date of Patent: Dec. 24, 2013

(54) WAFER ORIENTATION SENSOR

(75) Inventors: Juergen Hellwig, Aufhausen (DE);
Stefan Goetz, Sinzing (DE)

(73) Assignee: Infineon Technologies AG, Neubiberg (DE)

( * ) Notice: Subject to any disclaimer, the term of this patent is extended or adjusted under 35 U.S.C. 154(b) by 169 days.

(21) Appl. No.: 13/169,426

(22) Filed: Jun. 27, 2011

(65) Prior Publication Data
US 2012/0327428 A1  Dec. 27, 2012

(51) Int. Cl.
*G01B 11/14* (2006.01)

(52) U.S. Cl.
USPC .......................................... 356/614

(58) Field of Classification Search
USPC ............... 356/614–625; 250/559.44, 559.36, 250/559.4, 566; 414/935–939
See application file for complete search history.

(56) References Cited

U.S. PATENT DOCUMENTS

| | | | | |
|---|---|---|---|---|
| 3,796,497 A * | 3/1974 | Mathisen et al. ........ 356/139.07 |
| 4,819,167 A * | 4/1989 | Cheng et al. .................... 700/59 |
| 4,833,790 A * | 5/1989 | Spencer et al. ................. 33/520 |
| 5,546,179 A * | 8/1996 | Cheng ............................. 356/73 |
| 5,690,744 A * | 11/1997 | Landau ......................... 118/715 |
| 6,040,585 A | 3/2000 | Hsiao |
| 6,051,845 A * | 4/2000 | Uritsky ...................... 250/559.3 |
| 6,162,008 A * | 12/2000 | Perkins et al. ................ 414/754 |
| 6,710,364 B2 * | 3/2004 | Guldi et al. ............. 250/559.44 |
| 7,151,609 B2 * | 12/2006 | Chalmers et al. ............. 356/630 |
| 8,135,486 B2 * | 3/2012 | Shindo .......................... 700/114 |
| 2001/0042845 A1 * | 11/2001 | van der Muehlen et al. ....................... 250/559.29 |
| 2002/0042153 A1 * | 4/2002 | Holcman et al. ................ 438/14 |
| 2002/0111710 A1 * | 8/2002 | Perlov et al. .................. 700/229 |
| 2006/0246690 A1 * | 11/2006 | Dordi et al. ................... 438/478 |

* cited by examiner

*Primary Examiner* — Sang Nguyen
(74) *Attorney, Agent, or Firm* — Slater & Matsil, L.L.P.

(57) ABSTRACT

A wafer orientation sensor includes a laser source, a laser detector, and an evaluator. The laser source is configured to emit a laser beam in a direction of a wafer in an evaluation region of the wafer orientation sensor so that the laser beam is reflected at a main surface of the wafer resulting in a reflected laser beam. The laser detector is configured to receive the reflected laser beam at least when the wafer is within a tolerance range regarding the orientation of the wafer. The evaluator is configured to receive a beam reception information from the laser detector and to determine an orientation information based on the beam reception information.

27 Claims, 7 Drawing Sheets

US 8,614,797 B2

WAFER ORIENTATION SENSOR

TECHNICAL FIELD

Embodiments of the present invention relate to a wafer orientation sensor, for example, for determining or checking an orientation of a semiconductor wafer during semiconductor device fabrication. Embodiments of the present invention relate to a method for determining or checking an orientation of a wafer.

BACKGROUND

Semiconductor device fabrication typically makes use of electrochemical processes such as electroplating for defining and/or creating the structures of the semiconductor devices. During the electrochemical processes, a wafer typically needs to be protected by means of a special form seal (typically a seal ring) against wetting of the wafer backside and the wafer edge by the process liquid. By doing so it is intended that the chemical process reacts at the chip front side only.

In order for the form seal to work efficiently, the wafer must have a relatively precise position and orientation when being in contact with the form seal. An incorrect orientation of the wafer with respect to the form seal may lead to an erroneous processing of the wafer, which goes along with discarding the erroneously processed wafer. A wafer that has been incorrectly loaded and has an incorrect orientation relative to the form seal also negatively affects subsequent wafers, because a contaminated form seal loses its tightness. This may lead to unscheduled downtimes of wafer production equipment and damage to expensive plant sections.

SUMMARY OF THE INVENTION

According to one aspect of the teachings disclosed herein, a wafer orientation sensor comprises a laser source, a laser detector, and an evaluator. The laser source is configured to emit a laser beam in a direction of a wafer in an evaluation region of the wafer orientation sensor so that the laser beam is reflected at a main surface of the wafer resulting in a reflected laser beam. The laser detector is configured to receive the reflected laser beam at least when the wafer is within a tolerance range regarding the orientation of the wafer. The evaluator is configured to receive a beam reception information from the laser detector and to determine an orientation information based on the beam reception information.

According to another aspect of the teachings disclosed herein, a wafer orientation sensor comprises a laser distance measuring device, a comparator, and a logic circuit. The laser distance measuring device is configured to measure a distance to a main surface of a wafer by means of emitting a laser beam and receiving a reflected laser beam when the wafer is placed in an evaluation region of the wafer orientation sensor. The comparator is configured to compare the measured distance with a threshold distance value and to generate a comparison result. The logic circuit is configured to determine an orientation information on the basis of the comparison result.

According to a further aspect of the teachings disclosed herein, a wafer orientation sensor comprises a means for measuring a distance to a main surface of a wafer via an emission of a laser beam and a reception of a corresponding reflected laser beam, when the wafer is placed in an evaluation region of the wafer orientation sensor. The wafer orientation sensor also comprises a means for comparing a distance measure, generated by the means of measuring a distance, with a threshold distance value and to generate a comparison result, and a means for determining an orientation information on the basis of the comparison result.

According to a further aspect of the teachings disclosed herein, a method for determining an orientation of a wafer during a processing of the wafer comprises emitting a laser beam in a direction of the wafer within an evaluation area so that the laser beam is reflected at a main surface of the wafer resulting in a reflected laser beam. The reflected laser beam is received and beam reception information is derived therefrom. An orientation information is determined based on the beam reception information.

According to a further aspect of the teachings disclosed herein, a method for checking an orientation of a wafer during a processing of the wafer comprises measuring a distance to a particular location on a main surface of the wafer by means of emitting a laser beam. A corresponding reflected laser beam is received and the distance is compared with a threshold distance to obtain a comparison result. An orientation information is determined on the basis of the comparison result.

BRIEF DESCRIPTION OF THE DRAWINGS

Embodiments of the present invention will be described in the following using the accompanying figures, in which.

DETAILED DESCRIPTION OF ILLUSTRATIVE EMBODIMENTS

Before embodiments of the present invention will be explained in more detail using the accompanying figures, it is to be pointed out that the same elements or elements with the same function will be provided with the same reference numbers and that a repeated description of elements provided with the same reference numbers is omitted. Therefore, descriptions of elements provided with the same reference numbers are mutually exchangeable.

Figure 1:
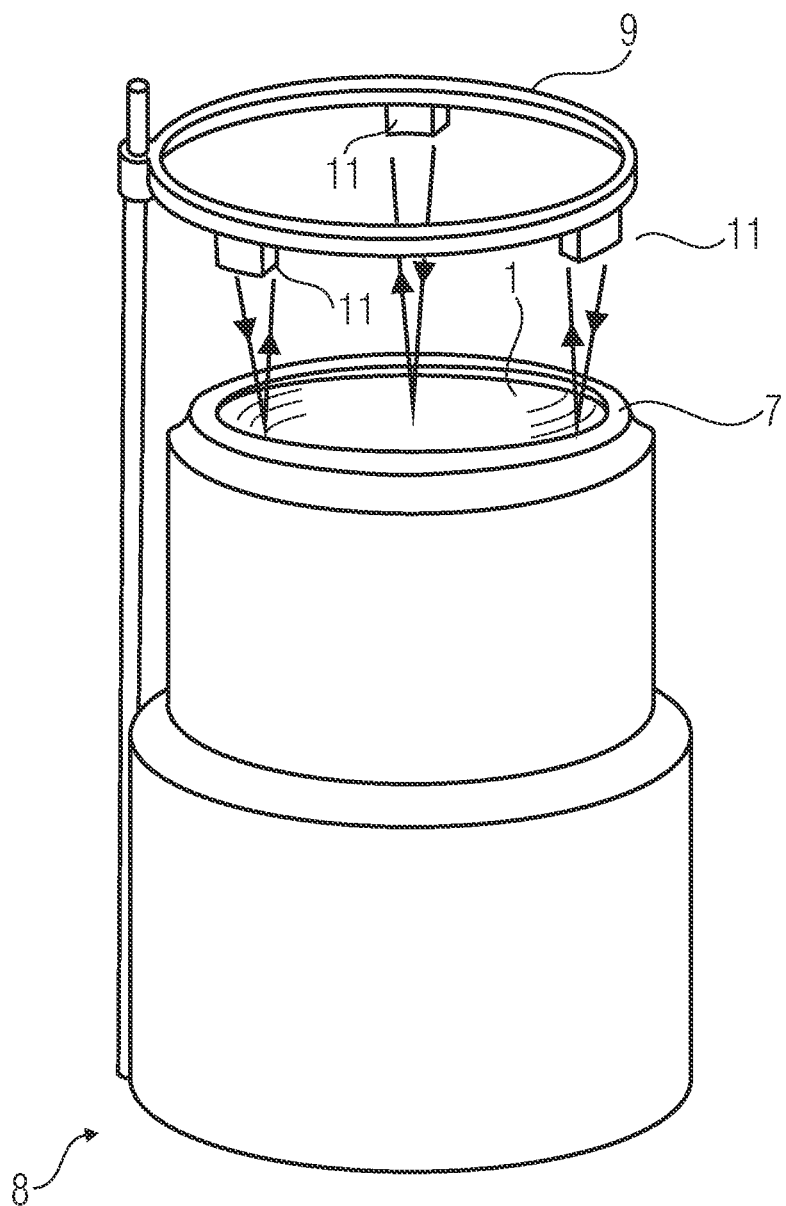
FIG. 1 shows a schematic perspective view of an electroplating equipment comprising a wafer orientation sensor according to the teachings disclosed herein.

FIG. 1 shows a perspective view of an electroplating equipment as it may be used during semiconductor device fabrication. In particular, FIG. 1 shows a process head 8 of the electroplating equipment. A wafer 1 is fixed to the process head 8 by means of a seal 7. The process head 8 loaded with the wafer 1 is displaceable to an electroplating cell (not shown) where an exposed surface of the wafer 1 is processed according to the electroplating technique. Mounted to the process head 8 is a swivelable rack 9. The rack 9 supports three laser units 11, each comprising a laser source and a laser sensor. The laser units 11 each emit a laser beam in the direction of the main surface of the wafer 1. The main surface of the wafer 1 reflects the laser beam and the reflected laser beam ideally goes back to the same one of the three laser units 11. By measuring either an angle of the reflected beam or a total path length of the laser beams and their associated reflected laser beams, it is possible to determine whether the wafer 1 is in the correct orientation with respect to the seal 7.

Following a verification of the correct orientation of the wafer 1, the rack 9 may be pivoted away from the process head 8 so that the process head 8 may get into contact, via the seal 7, with the electroplating cell by pushing the process head upwards, for example.

As shown in FIG. 1 it is possible to mount three laser sensors or units 11 (e.g., CMOS laser sensors) at the fixed rack 9 relatively close over the rotatable process head 8. Prior to the beginning of the process, the wafer 1 is situated in the process head 8. The wafer 1 may have been inserted into the process head 8 by means of a robot. The three laser sensors 11 are mounted to the rack 9 in an equidistant and circular manner. Each sensor is installed and adjusted so that the laser beam it emits hits the wafer 1 approximately 1 cm from the wafer edge and is reflected by the wafer surface. The measured values represent the orientation of the wafer in a plane. An ideal wafer orientation may be stored as a desired value at a sensor amplifier and signifies that the wafer 1 lies optimally tight at the seal 7. Only given this "ok signal" an enablement is generated in the equipment control electronic which enables a subsequent process operation. During the subsequent process operation the wafer 1 may be immersed in the process bath. In case an enablement does not occur, a manual correction by an operator of the equipment may take place. With this sensor technology the surface condition and the wafer material (silicon, plastic, eWLB-wafer (Embedded Wafer Level Ball Grid Array), etc.) are not an issue, anymore. The wafers may be dry or wet. The chip size is not an issue.

Wafer orientation sensors according to the teachings disclosed herein may be integrated into a large variety of electroplating equipment and other equipment for wafer processing. The evaluation electronics allow a (hardware-sided) series connection of existing control signals. Therefore, a modification of currently employed software is not necessary which may result in cost savings and integration flexibility. A wafer orientation sensor using laser sensors may achieve measurement accuracies smaller than 0.5 mm.

Figure 2:
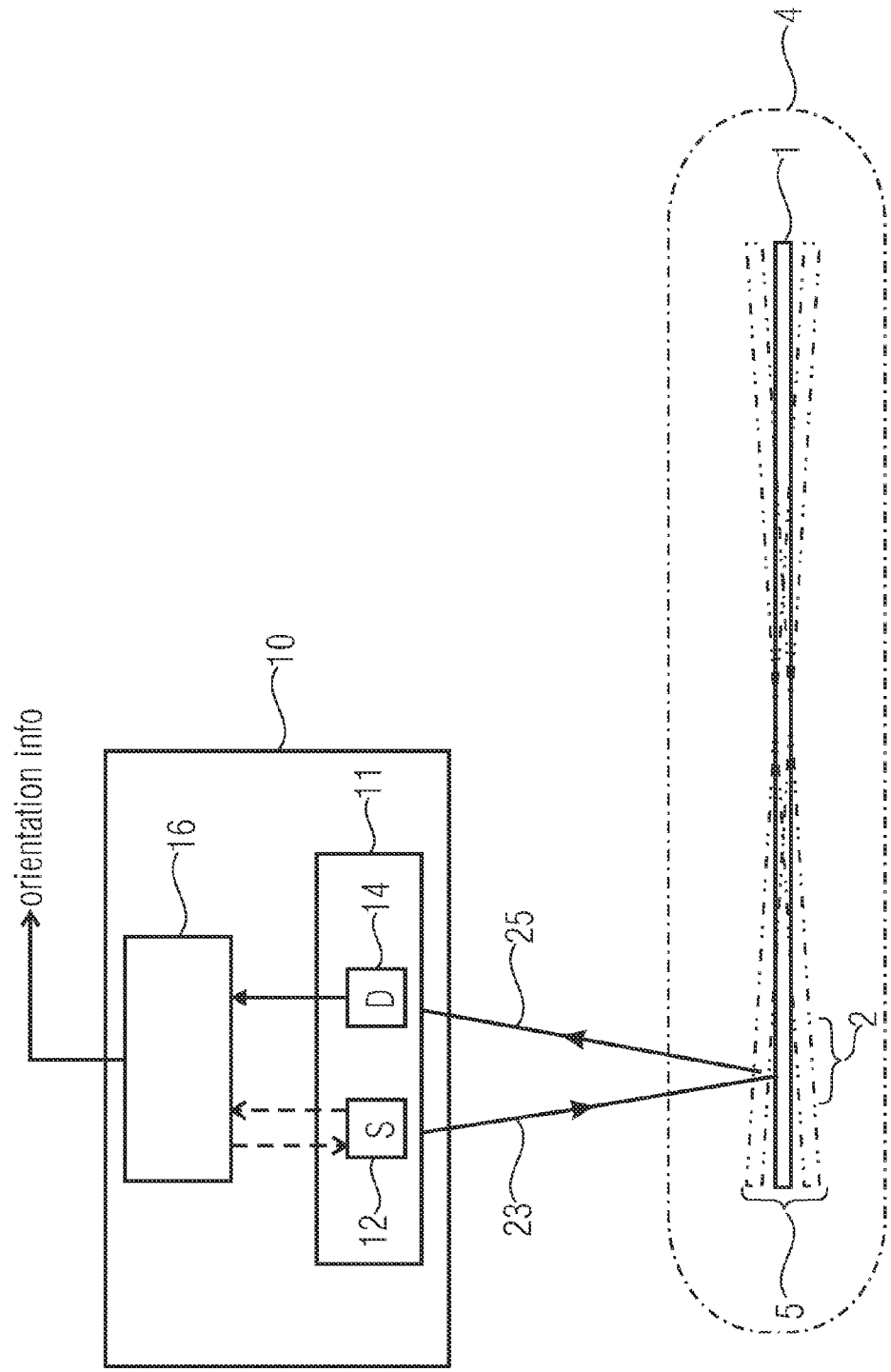
FIG. 2 shows a schematic illustration of a functional principle of a wafer orientation sensor according to an embodiment of the disclosed teachings.

FIG. 2 shows a schematic side view of a wafer 1 and some components of a wafer orientation sensor 10 according to the teachings disclosed herein.

The wafer 1 is shown within an evaluation area 4 of the wafer orientation sensor 10. The evaluation area 4 is schematically represented by a dash-dot line in FIG. 2 and corresponds to an imaginary or real work area of the wafer orientation sensor 10. The wafer orientation sensor 10 is configured to determine or check an orientation of the wafer 1 currently being present in the evaluation area 4.

Also depicted in FIG. 2 is, in a schematic manner, a tolerance range 5 regarding the orientation of the wafer 1. The tolerance range 5 is represented by dashed-dot-dot lines corresponding to the wafer 1 in an upper limit orientation and a lower limit orientation, respectively. In the limit orientations the wafer 1 is tilted about an axis perpendicular to the drawing plane of FIG. 2. Note that the tolerance range may also include tilting of the wafer 1 about an axis that is parallel to the drawing plane. The tolerance range regarding the orientation of the wafer 1 indicates the range of orientations of the wafer 1 which are detectable by the wafer orientation sensor 10.

The wafer orientation sensor 10 comprises a laser unit 11 and an evaluator 16. The laser unit 11 comprises a laser source 12 and a laser detector 14. The laser source 12 is configured to emit a laser beam 23 in the direction of the wafer 1 and, more particularly, in the direction of a target area 2 of the wafer 1. The laser beam 23 is reflected by the surface of the wafer 1 so that a reflected laser beam 25 is emitted by the surface of the wafer 1 at an angle of reflection. Under the condition that the wafer 1 is positioned within the evaluation area 4 and has an orientation within the tolerance range 5, the reflected laser beam 25 impinges on the laser detector 14 of the wafer orientation sensor 10.

The evaluator 16 of the wafer orientation sensor 10 receives a beam reflection information from the laser detector 14. The evaluator 16 may also intercommunicate with the laser source 12, either by controlling the laser source 12 to emit the laser beam 23 at a certain time instant or by receiving an information from the laser source 12 regarding a time of emission of the laser beam 23. A time difference between the time of emission and a time of reception of the reflected laser beam 25 at the laser detector 14 is a function of a distance between the wafer orientation sensor 10 and the surface of the wafer 1, in particular a total path length of the laser beam 23 and the reflected laser beam 25. The evaluator 16 may be configured to determine an orientation information based on the determined time difference and/or the total path length. As the spatial relation between the laser source 12 and the laser detector 14 is known, a vertical position of the wafer surface within the target area 2 may be determined by the wafer orientation sensor 10, the vertical position corresponding to a current orientation of the wafer 1 if the position of another point of the wafer outside the target area 2 is known and/or fixed.

Figure 3:
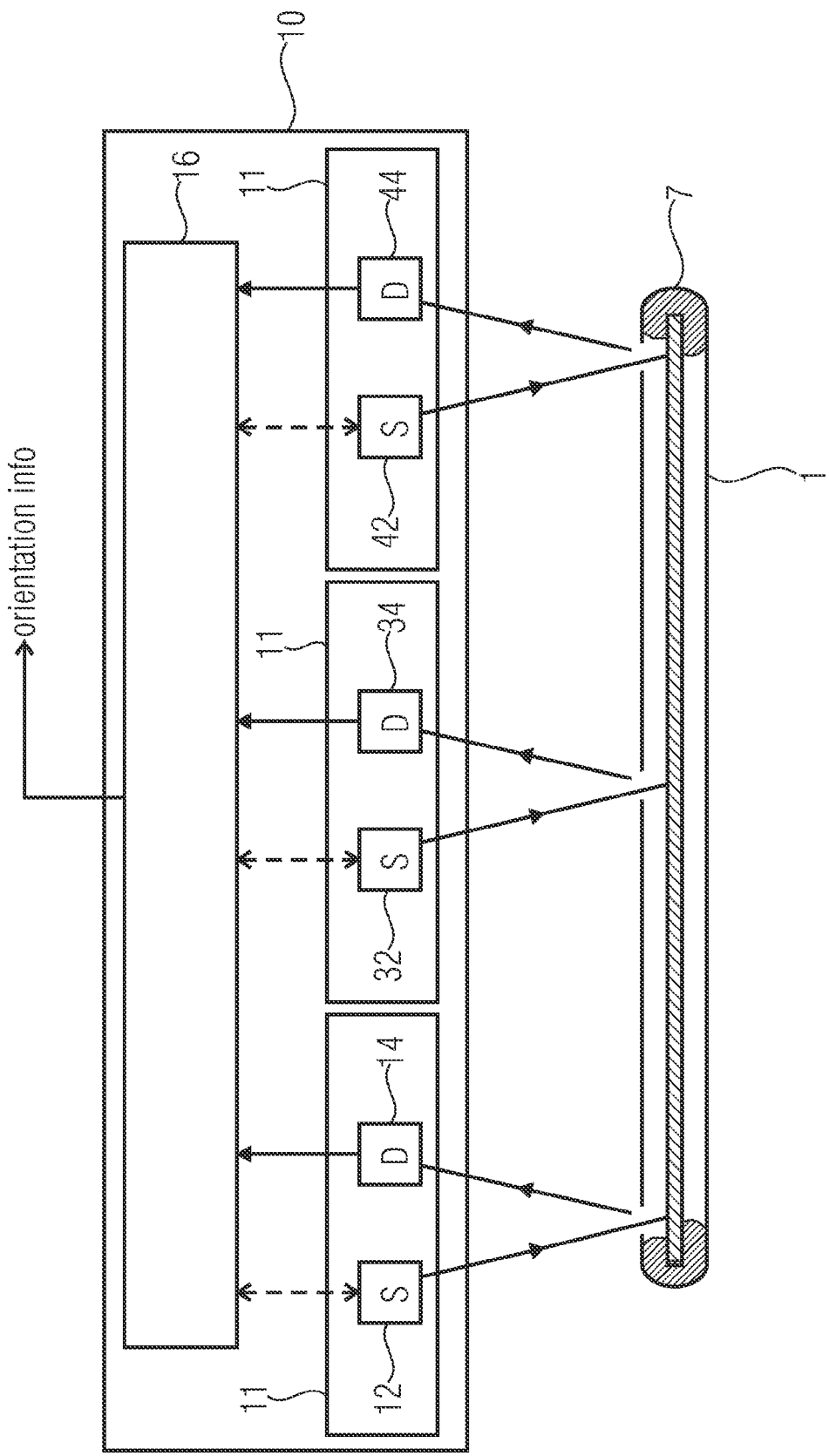
FIG. 3 shows a schematic illustration of a functional principle of a wafer orientation sensor according to an embodiment of the disclosed teachings comprising three laser sources and three laser detectors.

FIG. 3 shows a schematic side view of a wafer 1 and some components of a wafer orientation sensor 10 according to another aspect of the teachings disclosed herein employing three laser units 11 instead of one laser unit 11 as shown in FIG. 2. The wafer 1 is positioned at or on a seal 7 (shown in a cross sectional view). A first laser unit 11 comprises the laser source 12 and the laser detector 14. A second laser unit 11 and a third laser unit 11 comprise a laser source 32, 42, respectively, and a laser detector 34, 44, respectively. Wafer orientation sensing may be performed by sending a laser beam from each one of the laser sources 12, 32, and 42 towards the main surface of the wafer 1 facing the laser units 11. After reflection of the laser beams, three reflected laser beams are sent back to the respective laser units 11 where they are received by the associated laser detector 14, 34, or 44.

The respective beam reflection information is transmitted to the evaluator 16 by the three laser detectors 14, 34, 44. The evaluator may determine a wafer plane as the wafer orientation information on the basis of the transmitted beam reflection information. For example, the three points on the wafer surface where the three laser beams are reflected may be used to calculate the parameters a, b, c, and d of a plane in the form $ax+by+cz+d=0$. In particular, the following system of equations may be solved by the evaluator 16:

$$ax_1+by_1+cz_1+d=0$$

$$ax_2+by_2+cz_2+d=0$$

$$ax_3+by_3+cz_3+d=0$$

where $(x_1, y_1, z_1)$ represents the point of reflection of the first laser beam, $(x_2, y_2, z_2)$ represents the point of reflection of the second laser beam, and $(x_3, y_3, z_3)$ represents the point of reflection of the third laser beam on the wafer surface. Other methods to determine the orientation of the wafer plane are also possible.

Instead of three laser beams, another number of laser beams and of laser sources/detectors may be used, such as two, four, or more.

Figure 4:
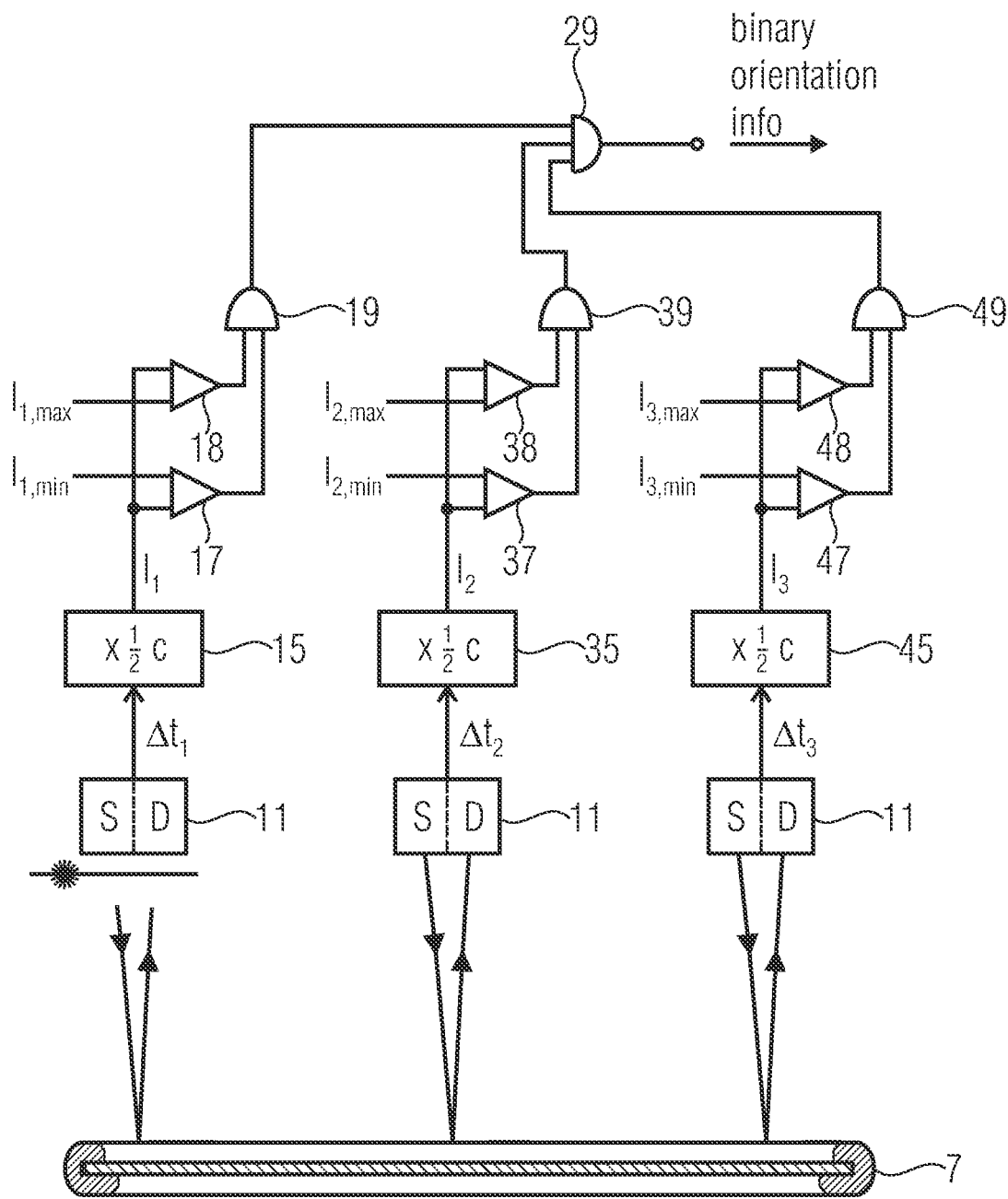
FIG. 4 shows a schematic block diagram of a wafer orientation sensor according to another embodiment of the teachings disclosed herein.

FIG. 4 shows a schematic block diagram of a wafer orientation sensor according to another aspect of the teachings disclosed herein. The wafer orientation sensor comprises three laser units 11 and each one of the laser units 11 is configured to output a time difference $\Delta t_1$, $\Delta t_2$, $\Delta t_3$ between an emission of a laser beam and a reception of a corresponding reflected laser beam. Each one of the laser units 11 is connected to one of three scaling elements 15, 35, 45. The scaling elements 15, 35, 45 multiply the time differences $\Delta t_1$, $\Delta t_2$, $\Delta t_3$ with ½c, i.e., half the velocity of light, in order to determine distances $1_1$, $1_2$, $1_3$ between the laser units 11 and the surface of the wafer 1. The factor ½ comes from fact that the time differences $\Delta t_1$, $\Delta t_2$, $\Delta t_3$ correspond to double the distances $1_1$, $1_2$, $1_3$ as the reflected laser beams have approximately the same lengths as the corresponding laser beams emitted by the laser units 11. At the respective outputs of the scaling elements 15, 35, 45. Note that the scaling elements 15, 35, 45 are not necessary because the time differences $\Delta t_1$, $\Delta t_2$, $\Delta t_3$ are equivalent to the distances $1_1$, $1_2$, $1_3$ up to the constant factor ½c and may be expressed in, e.g., light nanoseconds.

At their respective outputs the scaling elements 15, 35, 45 are connected to comparators 17, 18, 37, 38, 47, and 48 respectively. The comparators 17, 37, 47 are configured to compare the distances $1_1$, $1_2$, and $1_3$ with corresponding lower threshold values $1_{1,min}$, $1_{2,min}$, and $1_{3,min}$, respectively. The comparators 17, 37, 47 produce a logical "high" if the corresponding distance $1_1$, $1_2$, or $1_3$ is higher than the corresponding lower threshold value $1_{1,min}$, $1_{2,min}$, or $1_{3,min}$. The comparators 18, 38, 48 are configured to compare the distances $1_1$, $1_2$, and $1_3$ with corresponding upper threshold values $1_{1,max}$, $1_{2,max}$, and $1_{3,max}$, respectively, and produce a logical "high" if the corresponding distance $1_1$, $1_2$, or $1_3$ is lower than the corresponding upper threshold values $1_{1,max}$, $1_{2,max}$, or $1_{3,max}$.

The evaluator 16 further comprises three logical AND gates 19, 39, and 49. The AND gate 19 combines the outputs of the comparators 17 and 18. The AND gate 39 combines the outputs of the comparators 37 and 38. The AND gate 49 combines the outputs of the comparators 47 and 48. Thus, the output of the logical AND gate 19 indicates that the distance $1_1$ is within the desired range limited by the lower threshold $1_{1,min}$ and the upper threshold $1_{1,max}$. Accordingly the wafer surface deviates, at the reflection point of the first laser beam, at the most by $1_{1,max}-1_{1,min}$ from an ideal position which is assumed to be somewhere in the desired range, if the output of the AND gate 19 is "high". Similar observations are applicable to the second and third laser sensors and their respective AND gates 39, 49.

The outputs of the AND gates 19, 39, and 49 are further combined by another AND gate 29 having three inputs. An output of the further AND gate 29 indicates whether all of the distances $1_1$, $1_2$, and $1_3$ are within their respective desired ranges. The wafer 1 may be assumed to be acceptably oriented if this is the case, i.e., the output of the further AND gate 29 is "high". By observing a deviation of the wafer surface at three different locations in a direction orthogonal to the wafer surface it is thus possible to determine whether the orientation of the wafer 1 is allowable, in order to prevent leakage between the wafer 1 and the seal 7. The orientation information is provided at the output of the further AND gate 29 in the form of a binary signal which may be directly used by a process control system.

Figure 5:
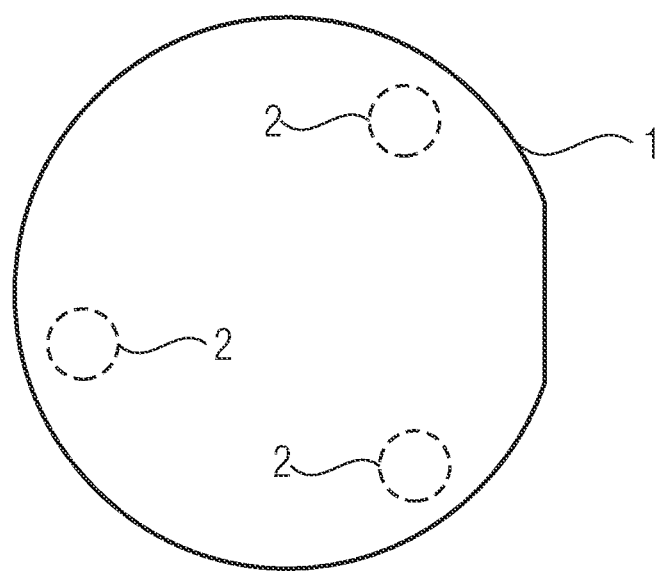
FIG. 5 shows a top view of a wafer to illustrate possible laser beam target areas.

FIG. 5 shows a top view of a wafer 1. Three target areas 2 are schematically depicted as dashed circles. The target areas 2 indicate the possible locations where the three laser beams are reflected at the wafer surface. The target areas 2 are relatively close to an edge of the wafer and angularly spaced at 120 degrees with respect to each other. With an arrangement of three sensors at an angular spacing of 120 degrees close to the edge of the wafer, a highly precise monitoring of the wafer orientation with respect to a horizontal orientation can be achieved.

Figure 6:
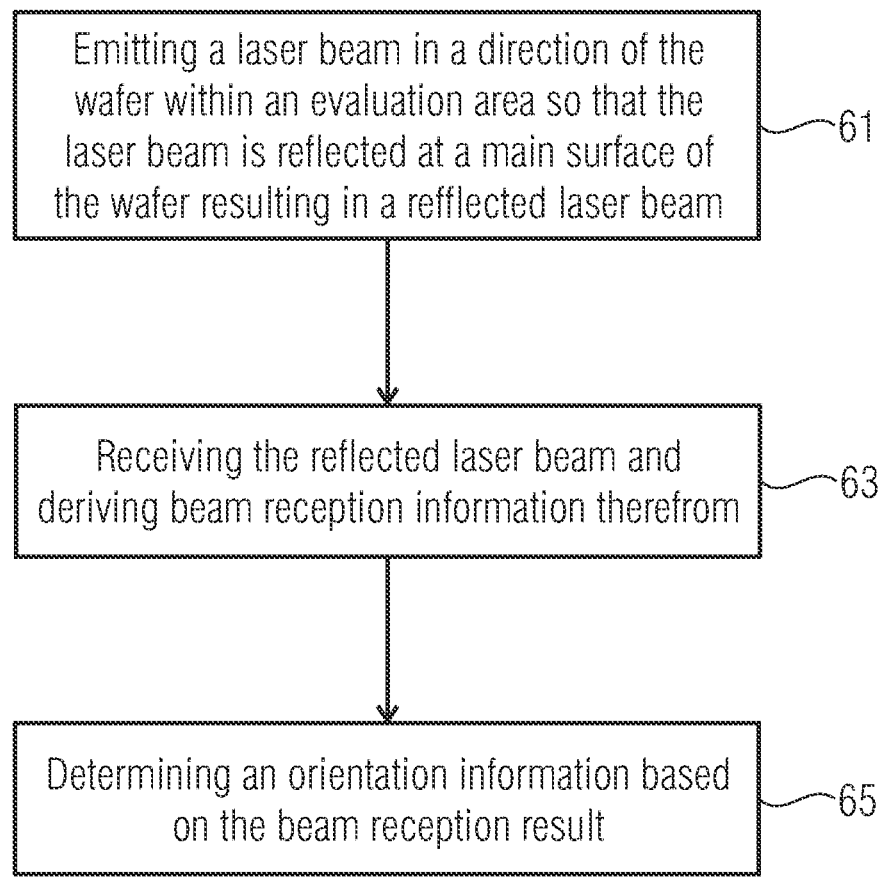
FIG. 6 shows a schematic flow diagram of a method for determining a wafer orientation.

FIG. 6 shows a schematic flow diagram of a method for determining a wafer orientation. At an action 61 a laser beam is emitted by a laser source in a direction of the wafer within an evaluation area so that the laser beam is reflected at a main surface of the wafer. The reflection of the laser beam results in a reflected laser beam. At an action 63 the reflected laser beam is received at a laser detector that typically is associated to the laser source mentioned above. Beam reception information may be derived from the event of receiving the reflected laser beam. The beam reception information may comprise a (highly precisely measured) time instant of the reception or a location where the laser detector receives the reflected laser beam. In the latter case the laser detector may comprise a plurality of detector elements arranged in a line or an array.

As indicated in FIG. 6 by the box corresponding to an action 65, an orientation information is then determined on the basis of the beam reception information. The orientation information may be a numerical result (e.g., parameters of a wafer plane), a binary result (e.g., "wafer orientation within specified range" or "wafer orientation outside specified range"), a fuzzy result, or a logical result.

As indicated by the box corresponding to an action 67, the wafer may be processed after being properly oriented. Any process could be performed here. For example, the processing can comprise electroplating as discussed above. Other processing steps could alternatively be performed.

Figure 7:
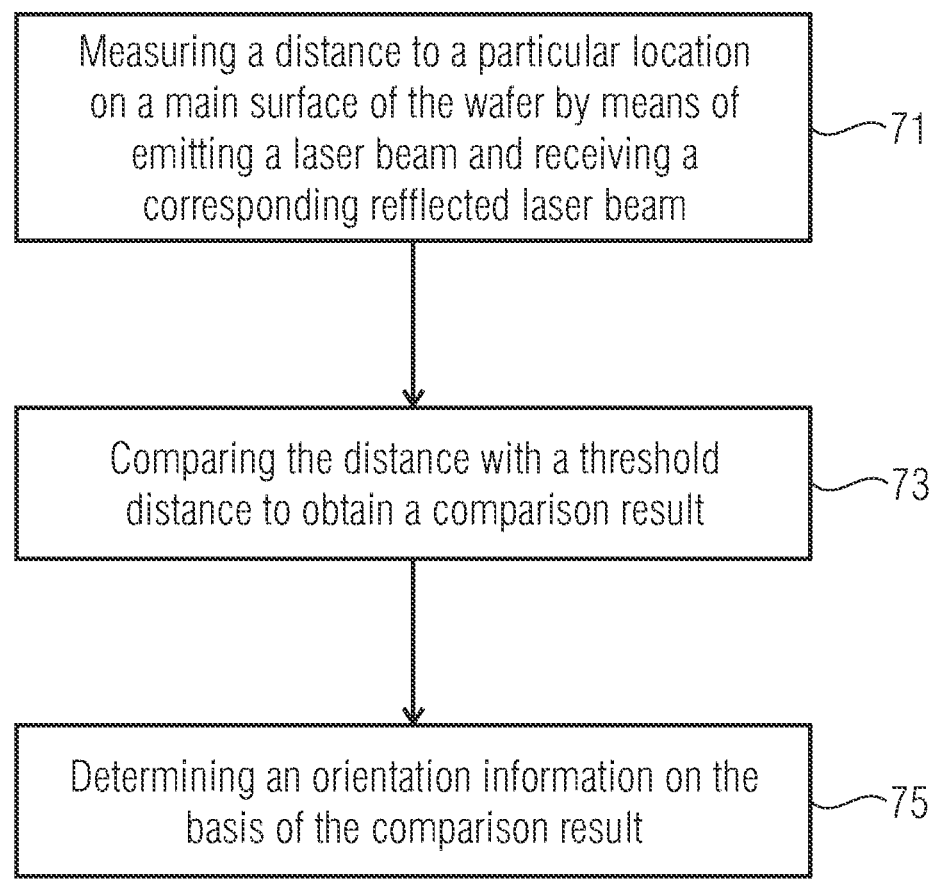
FIG. 7 shows a schematic flow diagram of a method for checking a wafer orientation.

FIG. 7 shows a schematic flow diagram of a method for checking a wafer orientation. A distance to a particular location, typically within a target area, on a main surface of the wafer is measured, at an action 71 of the method, by means of emitting a laser beam and receiving a corresponding reflected laser beam. The measured distance is compared with a threshold distance at an action 73. This is done to obtain a comparison result. At an action 75, an orientation information is determined on the basis of the comparison result. As above, the orientation information may be numerical, binary, logical, or fuzzy. At an action 77, the wafer is processed.

The methods outlined in the schematic flow diagrams in FIGS. 6 and 7 may be extended to use three laser sources, laser detectors, or laser distance measuring devices, as illustrated above in the context of the wafer orientation sensor. Furthermore, it may be possible to use a single laser source and several laser detectors, or several laser sources and a single laser detector. In the former case, a laser beam emitted by the single laser source may be split into several laser beams directed at different locations of the wafer surface. This results in several reflected laser beams reaching the several laser detectors. Splitting the laser beam may be done, e.g., by a prism or a moveable minor.

Generally, the laser sensors may be fixed relatively close above the process head at the equipment. Typically, the closer the sensors are to the object to be measured, the more precise the acquisition of the wafer orientation. It is suggested that the laser unit(s) or sensor(s) 11 is/are arranged that the laser beam(s) hit(s) the wafer surface at a slight angle and possibly very close to the wafer edge. The reflected beam(s) is/are then reflected back to the laser unit(s) 11. An arrangement of three sensors with an angular displacement of 120 degrees typically assures a precise determination of the wafer orientation with respect to the horizontal direction. As a single laser sensor 11 is capable of detecting altitude differences of less than 0.5 mm, a correct tightness of the wafer 1 can be provided. The laser sensors may be devices that comprise a CMOS component capable of sensing very small distance modifications between the sensors and the objects to be measured. Each of the three sensors (or another number of sensors) is adjustable individually in a mechanical manner and an electronic manner. It is typically irrelevant which surfaces, materials or surface conditions (wet or dry) are to be detected.

A loading process of a process step may comprise the following actions:

1. The process head is in its loading position and a push plate is in a lower end position ("push plate open");
2. The wafer is placed on a transfer point by a robot;
3. The push plate is closed.

The push plate going upward pushes the process wafer 1 in the seal 7. The end orientation or end position of one locking cylinder among three locking cylinders is queried. As soon as the query returns the result "push plate closed", the process may continue. The wafer orientation sensor according to the teachings disclosed herein may intervene at this point by inserting an additional relay connected in series with the above mentioned query so that the query circle is closed only, when the correct wafer orientation has been signaled.

The wafer is pushed into a specific end position. At the same time, each of the laser sensors measures the distance to the wafer. In the case of a correctly loaded wafer, each one of the sensors outputs an enable signal to the evaluator or an evaluation logic. The evaluator or the evaluation logic controls the downstream relay so that the signal circle is closed.

4. The generated signal "push plate closed" (for all three locking cylinders) now provides the enable signal for the subsequent process operation. The wafer may now be processed.

By implementing the sensor unit in an existing signal circuit, it is possible to avoid software modifications within the process control system. The procedures to follow in case of malfunctions may be communicated to the operational staff of the semiconductor fabrication equipment separately (handling instructions).

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like, for example, a microprocessor, a programmable computer or an electronic circuit. In some embodiments, some one or more of the most important method steps may be executed by such an apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A wafer orientation sensor, comprising:
   a laser source configured to emit a laser beam in a direction of a wafer in an evaluation region of the wafer orientation sensor so that the laser beam is reflected at a main surface of the wafer resulting in a reflected laser beam;
   a laser detector configured to receive the reflected laser beam at least when the wafer is within a tolerance range; and
   an evaluator configured to receive beam reception information from the laser detector and to determine wafer orientation information regarding a wafer tilt based on the beam reception information.

2. The wafer orientation sensor according to claim 1, wherein the evaluator comprises a distance measuring unit configured to determine a total path length of the laser beam and the reflected laser beam on the basis of the beam reception information to determine the orientation information as a function of the total path length.

3. The wafer orientation sensor according to claim 1, wherein the laser beam is reflected within an edge region of the main surface of the wafer when the wafer is within the tolerance range regarding the orientation of the wafer.

4. The wafer orientation sensor according to claim 1, wherein the laser source and the laser detector are adjacent to each other.

5. The wafer orientation sensor according to claim 1, wherein the laser beam hits the wafer at an angle different than 90° when the wafer is approximately in a desired orientation.

6. The wafer orientation sensor according to claim 1, further comprising a wafer orientation signal output configured to provide the orientation information in the form of an enable signal to a wafer processing control system.

7. The wafer orientation sensor according to claim 1, further comprising:
   a second laser source and a third laser source configured to emit a second laser beam and a third laser beam towards the wafer in the evaluation region so that the second laser beam and the third laser beam are reflected at the main surface of the wafer resulting in a second reflected laser beam and a third reflected laser beam, respectively, wherein the laser beam, the second laser beam and the third laser beam are reflected at different locations of the main surface; and
   a second laser detector and a third laser detector configured to receive the second reflected laser beam and the third reflected laser beam at least when the wafer is within the tolerance range;
   wherein the evaluator is further configured to receive second beam reception information from the second laser detector and third beam reception information from the third laser detector and comprises a distance measuring unit configured to determine, on the basis of the beam reception information, the second beam reception information and the third beam reception information, a total path length of the laser beam and the reflected laser beam, a second total path length of the second laser beam and the second reflected laser beam, and a third total path length of the third laser beam and the third reflected laser beam, and configured to determine the orientation information as functions of the total path length, the second total path length, and the third total path length.

8. The wafer orientation sensor according to claim 7, wherein the evaluator further comprises comparators configured to compare the total path length, the second total path length, and the third total path length with corresponding allowable ranges resulting in corresponding comparison results and to determine the orientation information as a Boolean combination of the comparison results, the orientation information indicating whether the orientation of the wafer is within an allowable orientation range.

9. The wafer orientation sensor according to claim 7, wherein the evaluator is further configured to determine a wafer plane on the basis of the total path length, the second total path length, and the third total path length and to compare the wafer plane with a desired wafer plane and to derive the wafer orientation information from the determined wafer plane.

10. The wafer orientation sensor according to claim 7, further comprising a rack to which the laser source, the second laser source, the third laser source, the laser detector, the second laser detector, and the third laser detector are mounted.

11. A wafer orientation sensor, comprising:
a laser source configured to emit a laser beam in a direction of a wafer in an evaluation region of the wafer orientation sensor so that the laser beam is reflected at a main surface of the wafer resulting in a reflected laser beam;
a laser detector configured to receive the reflected laser beam at least when the wafer is within a tolerance range;
an evaluator configured to receive beam reception information from the laser detector and to determine wafer orientation information based on the beam reception information;
a second laser source and a third laser source configured to emit a second laser beam and a third laser beam towards the wafer in the evaluation region so that the second laser beam and the third laser beam are reflected at the main surface of the wafer resulting in a second reflected laser beam and a third reflected laser beam, respectively, wherein the laser beam, the second laser beam and the third laser beam are reflected at different locations of the main surface; and
a second laser detector and a third laser detector configured to receive the second reflected laser beam and the third reflected laser beam at least when the wafer is within the tolerance range;
wherein the evaluator is further configured to receive second beam reception information from the second laser detector and third beam reception information from the third laser detector and comprises a distance measuring unit configured to determine, on the basis of the beam reception information, the second beam reception information and the third beam reception information, a total path length of the laser beam and the reflected laser beam, a second total path length of the second laser beam and the second reflected laser beam, and a third total path length of the third laser beam and the third reflected laser beam, and configured to determine the orientation information as functions of the total path length, the second total path length, and the third total path length.

12. The wafer orientation sensor according to claim 11, wherein the evaluator further comprises comparators configured to compare the total path length, the second total path length, and the third total path length with corresponding allowable ranges resulting in corresponding comparison results and to determine the orientation information as a Boolean combination of the comparison results, the orientation information indicating whether the orientation of the wafer is within an allowable orientation range.

13. The wafer orientation sensor according to claim 11, wherein the evaluator is further configured to determine a wafer plane on the basis of the total path length, the second total path length, and the third total path length and to compare the wafer plane with a desired wafer plane and to derive the wafer orientation information from the determined wafer plane.

14. The wafer orientation sensor according to claim 11, further comprising a rack to which the laser source, the second laser source, the third laser source, the laser detector, the second laser detector, and the third laser detector are mounted.

15. A method for determining an orientation of a wafer during a processing of the wafer, the method comprising:
emitting a laser beam in a direction of the wafer within an evaluation area so that the laser beam is reflected at a main surface of the wafer resulting in a reflected laser beam;
receiving the reflected laser beam and deriving beam reception information therefrom;
determining an orientation information regarding a wafer tilt based on the beam reception information, wherein the determining is performed by an evaluator; and
performing the processing of the wafer using equipment for wafer processing.

16. The method according to claim 15, further comprising:
determining a total path length of the laser beam and the reflected laser beam on the basis of the beam reception information;
wherein determining the orientation information comprises taking into account the total path length so that the orientation information is a function of the total path length.

17. The method according to claim 15, wherein the laser beam hits the wafer at an angle different from 90° when the wafer is approximately in a desired orientation.

18. The method according to claim 15, further comprising outputting a wafer orientation signal output configured to provide the orientation information in a form of an enable signal to a wafer processing control system.

19. The method according to claim 15, wherein the processing of the wafer comprises electroplating portions of the wafer.

20. The method according to claim 15, further comprising:
emitting a second laser beam and a third laser beam in the direction of the wafer so that the laser beam, the second laser beam and the third laser beam are reflected at different locations of the main surface of the wafer and result in the reflected laser beam, a second reflected laser beam and a third reflected laser beam; and
receiving the second reflected laser beam and the third reflected laser beam and deriving second beam reception information and third beam reception information therefrom;
wherein determining the orientation information comprises:
determining a total path length of the laser beam and the reflected laser beam, a second total path length of the second laser beam and the second reflected laser beam, and a third total path length of the third laser beam and the third reflected laser beam, and
determining the orientation information as functions of the total path length, the second total path length, and the third total path length.

21. The method according to claim 15, wherein the laser beam is reflected within an edge region of the main surface of the wafer when the wafer is within a tolerance range regarding the orientation of the wafer.

22. A method for determining an orientation of a wafer during a processing of the wafer, the method comprising:
emitting a laser beam in a direction of the wafer within an evaluation area so that the laser beam is reflected at a main surface of the wafer resulting in a reflected laser beam;
receiving the reflected laser beam and deriving beam reception information therefrom;
determining an orientation information based on the beam reception information, wherein the determining is performed by an evaluator;
performing the processing of the wafer using equipment for wafer processing;
emitting a second laser beam and a third laser beam in the direction of the wafer so that the laser beam, the second laser beam and the third laser beam are reflected at different locations of the main surface of the wafer and result in the reflected laser beam, a second reflected laser beam and a third reflected laser beam; and
receiving the second reflected laser beam and the third reflected laser beam and deriving second beam reception information and third beam reception information therefrom;
wherein determining the orientation information comprises:
determining a total path length of the laser beam and the reflected laser beam, a second total path length of the second laser beam and the second reflected laser beam, and a third total path length of the third laser beam and the third reflected laser beam, and
determining the orientation information as functions of the total path length, the second total path length, and the third total path length.

23. The method according to claim 22, wherein the determining of the orientation information comprises:
comparing the total path length, the second total path length, and the third total path length with corresponding allowable ranges resulting in corresponding comparison results; and
determining the orientation information as a Boolean combination of the comparison results, the orientation information indicating whether the orientation of the wafer is within an allowable orientation range.

24. The method according to claim 22, wherein the determining of the orientation information comprises:
determining a wafer plane on the basis of the total path length, the second total path length, and the third total path length and to compare the wafer plane with a desired wafer plane and to derive the orientation information from the determined wafer plane.

25. The method according to claim 22, wherein the determining of the orientation information comprises:
comparing the total path length, the second total path length, and the third total path length with corresponding allowable ranges resulting in corresponding comparison results; and
determining the orientation information as a Boolean combination of the comparison results, the orientation information indicating whether the orientation of the wafer is within an allowable orientation range.

26. The method according to claim 22, wherein the determining of the orientation information comprises:
determining a wafer plane on the basis of the total path length, the second total path length, and the third total path length and to compare the wafer plane with a desired wafer plane and to derive the orientation information from the determined wafer plane.

27. A method for determining an orientation of a wafer during a processing of the wafer, the method comprising:
emitting a laser beam in a direction of the wafer within an evaluation area so that the laser beam is reflected at a main surface of the wafer resulting in a reflected laser beam;
receiving the reflected laser beam and deriving beam reception information therefrom;
determining an orientation information based on the beam reception information, wherein the determining is performed by an evaluator; and
performing the processing of the wafer using equipment for wafer processing;
wherein the laser beam is reflected within an edge region of the main surface of the wafer when the wafer is within a tolerance range regarding the orientation of the wafer.

* * * * *